United States Patent
Zhang et al.

(10) Patent No.: US 10,134,362 B2
(45) Date of Patent: Nov. 20, 2018

(54) DISPLAY DEVICE, DRIVING METHOD THEREOF, MANUFACTURING METHOD THEREOF AND ANTI-PEEPING DISPLAY SYSTEM

(71) Applicants: BOE TECHNOLOGY GROUP CO., LTD., Beijing (CN); BEIJING BOE DISPLAY TECHNOLOGY CO., LTD., Beijing (CN)

(72) Inventors: Chunbing Zhang, Beijing (CN); Xianjuan Zhan, Beijing (CN)

(73) Assignees: BOE TECHNOLOGY GROUP CO., LTD., Beijing (CN); BEIJING BOE DISPLAY TECHNOLOGY CO., LTD., Beijing (CN)

(*) Notice: Subject to any disclaimer, the term of this patent is extended or adjusted under 35 U.S.C. 154(b) by 55 days.

(21) Appl. No.: 15/513,722

(22) PCT Filed: Sep. 9, 2016

(86) PCT No.: PCT/CN2016/098566
§ 371 (c)(1),
(2) Date: Mar. 23, 2017

(87) PCT Pub. No.: WO2017/128726
PCT Pub. Date: Aug. 3, 2017

(65) Prior Publication Data
US 2018/0233108 A1      Aug. 16, 2018

(30) Foreign Application Priority Data

Jan. 26, 2016 (CN) .......................... 2016 1 0052354

(51) Int. Cl.
*G09G 5/10* (2006.01)
*H01L 27/32* (2006.01)
(Continued)

(52) U.S. Cl.
CPC .......... *G09G 5/10* (2013.01); *H01L 25/0657* (2013.01); *H01L 27/3209* (2013.01);
(Continued)

(58) Field of Classification Search
CPC ........ G09G 5/02; G09G 5/14; H04N 21/2347; H04N 21/4405
See application file for complete search history.

(56) References Cited

U.S. PATENT DOCUMENTS

| | | | | |
|---|---|---|---|---|
| RE36,654 E | * | 4/2000 | Conner | ............. G02F 1/133526 349/112 |
| 2002/0118162 A1 | * | 8/2002 | Sheridon | .............. G02B 26/026 345/107 |

(Continued)

FOREIGN PATENT DOCUMENTS

| | | |
|---|---|---|
| CN | 102360136 A | 2/2012 |
| CN | 104122705 A | 10/2014 |
| CN | 105552105 A | 5/2016 |

OTHER PUBLICATIONS

The First Chinese Office Action dated Jan. 3, 2018; Appln. No. 201610052354.X.
(Continued)

*Primary Examiner* — Sepehr Azari
(74) *Attorney, Agent, or Firm* — Ladas & Parry LLP

(57) ABSTRACT

A display device, a driving method thereof, a manufacturing method thereof and an anti-peeping display system are provided. The display device includes an interference display module and a first display panel disposed in a light-emitting direction of the interference display module. The light emitted by the interference display module is polarized light. In the display device, the light of an interference image generated by the interference display module will be super- (Continued)

imposed to light of a display image generated by the first display panel, so that users can only view an unordered image and cannot view a normal image when viewing the display device under glasses-free state. The light emitted by the interference display module is polarized light, so that the normal display image can be obtained by filtering the polarized light with polarization spectacles which can filter such polarized light.

16 Claims, 1 Drawing Sheet

(51) Int. Cl.
*G02B 5/30* (2006.01)
*H01L 25/065* (2006.01)
*H01L 51/52* (2006.01)
*G02C 7/12* (2006.01)
*G02C 7/10* (2006.01)

(52) U.S. Cl.
CPC ........ *H01L 51/5281* (2013.01); *G02B 5/3033* (2013.01); *G02B 5/3083* (2013.01); *G02C 7/104* (2013.01); *G02C 7/12* (2013.01)

(56) References Cited

U.S. PATENT DOCUMENTS

| | | | |
|---|---|---|---|
| 2003/0016327 A1* | 1/2003 | Kotchick | G06F 1/1609 349/149 |
| 2003/0128218 A1* | 7/2003 | Struyk | G09G 5/02 345/581 |
| 2006/0124897 A1* | 6/2006 | Shingai | G02F 1/133377 252/299.01 |
| 2008/0088649 A1* | 4/2008 | Ikeno | G09G 3/3611 345/690 |
| 2010/0092784 A1* | 4/2010 | Kamada | B32B 17/10 428/426 |
| 2010/0110345 A1* | 5/2010 | Sakai | G02F 1/133634 349/96 |
| 2010/0177112 A1* | 7/2010 | Miyasaka | G06F 21/84 345/589 |
| 2011/0141388 A1 | 6/2011 | Park et al. | |
| 2015/0138053 A1* | 5/2015 | Aiden | H04N 13/334 345/88 |
| 2017/0278443 A1* | 9/2017 | Zhang | H01L 51/5012 |
| 2018/0088415 A1* | 3/2018 | Zhang | G02F 1/133603 |

OTHER PUBLICATIONS

International Search Report and Written Opinion dated Dec. 14, 2016; PCT/CN2016/098566.

\* cited by examiner

DISPLAY DEVICE, DRIVING METHOD THEREOF, MANUFACTURING METHOD THEREOF AND ANTI-PEEPING DISPLAY SYSTEM

TECHNICAL FIELD

Embodiments of the present invention relate to a display device, a driving method thereof, a manufacturing method thereof and an anti-peeping display system.

BACKGROUND

With the development of network technology, more and more people execute operations such as shopping and account transaction on the Internet. During the operation, operators often need to input personal information on display devices such as computers, mobile phones, cash dispensers and ATM machines, so personal information disclosure tends to occur.

People pay more and more attention to personal privacy. Some anti-peeping display devices in the prior art. However, the anti-peeping display device in the prior art cannot satisfy people's requirements due to complex structure, low safety and easy crack.

SUMMARY

An embodiment of the invention provides a display device comprising an interference display module and a first display panel disposed in a light-emitting direction of the interference display module, wherein light emitted by the interference display module is polarized light; and the first display panel is configured to allow the polarized light to be transmitted therethrough.

In some examples, a color of each subpixel in the interference display module is respectively complementary to a color of a subpixel at a corresponding position of the first display panel.

In some examples, a size of each subpixel in the interference display module is equal to a size of the subpixel at the corresponding position of the first display panel.

In some examples, the first display panel includes red subpixels, green subpixels and blue subpixels; the interference display module includes cyan subpixels, magenta subpixels and yellow subpixels; the red subpixels in the first display panel correspond to the cyan subpixels in the interference display module in position; the green subpixels in the first display panel correspond to the magenta subpixels in the interference display module in position; and the blue subpixels in the first display panel correspond to the yellow subpixels in the interference display module in position.

In some examples, under a same input drive voltage, a brightness of the light emitted by the interference display module is the same with that of light emitted by the first display panel.

In some examples, the interference display module includes a second display panel and a first polarization layer disposed in a light-emitting direction of the second display panel.

In some examples, the interference display module further includes a first phase retardation film which is disposed between the first polarization layer and the first display panel.

In some examples, the first phase retardation film is a quarter-wave plate.

In some examples, each of the first display panel and the second display panel is an organic light-emitting diode (OLED) display panel.

In some examples, the first display panel is a transparent OLED display panel.

An embodiment of the invention provides an anti-peeping display system, comprising the display device as mentioned above and anti-peeping spectacles, wherein the anti-peeping spectacles include a spectacles frame and filter lenses; and the filter lenses are configured to filter the polarized light emitted by the interference display module.

In some examples, the filter lens includes a second phase retardation film which has an optical rotational direction opposite to that of the first phase retardation film, and a second polarization layer; and the second phase retardation film is disposed in an incident direction of the second polarization layer.

In some examples, the second phase retardation film is a quarter-wave plate.

An embodiment of the invention provides a display drive method, used for driving the display device as mentioned above, comprising: driving the interference display module to generate an interference image upon the first display panel displaying a normal image.

In some examples, the display device is the display device as mentioned above; and driving the interference display module to generate the interference image upon the first display panel displaying the normal image includes: inputting drive voltage into the interference display module, so that a brightness of the light emitted by the interference display module can be the same with a brightness of the light emitted by the first display panel.

In some examples, the display device is the display device as mentioned above; driving the interference display module to generate the interference image upon the first display panel displaying the normal image includes: inputting the drive voltage, which is the same with drive voltage inputted into the first display panel, into the interference display module.

An embodiment of the invention provides a method for manufacturing a display device, used for manufacturing the display device as mentioned above, comprising: providing a first display panel and an interference display module, in which the light emitted by the interference display module is polarized light; and arranging the first display panel in the light-emitting direction of the interference display module.

BRIEF DESCRIPTION OF THE DRAWINGS

Simple description will be given below to the accompanying drawings of the embodiments to provide a more clear understanding of the technical proposals of the embodiments of the present invention. Obviously, the drawings described below only involve some embodiments of the present invention but are not intended to limit the present invention.

DETAILED DESCRIPTION

Figure 1:
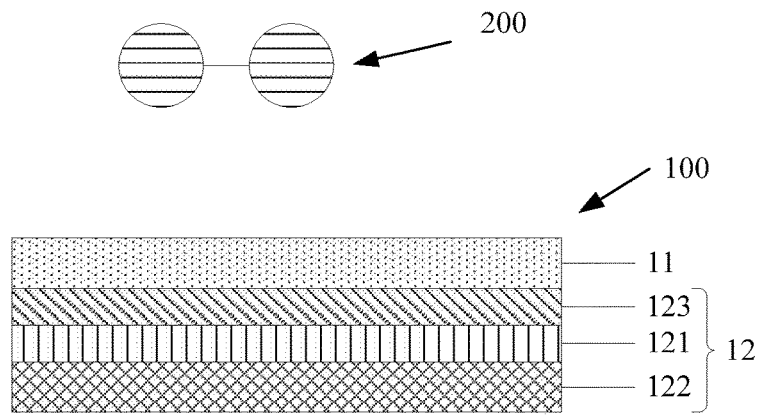
FIG. 1 is a schematic structural view of an anti-peeping display system provided by the embodiment of the present invention.

For more clear understanding of the objectives, technical proposals and advantages of the embodiments of the present invention, clear and complete description will be given below to the technical proposals of the embodiments of the present invention with reference to the accompanying drawings of the embodiments of the present invention. Obviously, the preferred embodiments are only partial embodiments of the present invention but not all the embodiments. All the other embodiments obtained by those skilled in the art without creative efforts on the basis of the embodiments of the present invention illustrated shall fall within the scope of protection of the present invention.

In the first aspect, the embodiment of the present invention provides a display device, which comprises an interference display module and a first display panel disposed in the light-emitting direction of the interference display module. Light emitted by the interference display module is polarized light.

The display device provided by the embodiment of the present invention adopts an interference image generated by the interference display module to interfere with a normal image, so that users can only view an unordered image and cannot view the normal image when viewing the display device under glasses-free state. The light emitted by the interference display module is polarized light. The light emitted by the interference display module and light emitted by the first display panel have different properties, so that the interference image can be filtered subsequently and the normal image can be obtained again, and hence the anti-peeping objective can be achieved.

In the second aspect, the embodiment of the present invention further provides an anti-peeping display system, which comprises the display device provided by the first aspect and anti-peeping spectacles. The anti-peeping spectacles include a spectacles frame and filter lenses. The filter lenses are configured to filter the polarized light emitted by the interference display module.

In the anti-peeping display system provided by the embodiment of the present invention, users can only view an unordered image and cannot view a normal image under glasses-free state, and can only view the normal image by wearing the anti-peeping spectacles capable of filtering the polarized light emitted by the interference display module, so that the anti-peeping objective can be achieved. Moreover, the device has simple structure and higher safety.

In the third aspect, the embodiment of the present invention further provides a display drive method, which can be used for driving the display device provided by the first aspect, and comprises: driving the interference display module to generate an interference image when the first display panel displays a normal image.

By adoption of the display drive method provided by the embodiment of the present invention, the light emitted by the first display panel and the light emitted by the interference display module have the same brightness, so that an image obtained after the superposition of the interference image and the normal image is displayed as white as a whole, and hence the interference effect of the interference display module can be better.

In the fourth aspect, the embodiment of the present invention further provides a method for manufacturing a display device, which can be used for manufacturing the display device provided by the first aspect, and comprises: providing a first display panel and an interference display module, in which light emitted by the interference display module is polarized light; and arranging the first display panel in the light-emitting direction of the interference display module.

In the method for manufacturing the display device provided by the embodiment of the present invention, the light emitted by the interference display module can interference with the light emitted by the first display panel, so that users can only view an unordered image and even a white image and cannot view a normal image when viewing the display device under glasses-free state. The light emitted by the interference display module is polarized light. The light emitted by the interference display module and the light emitted by the first display panel have different properties, so that the interference image can be filtered subsequently and the normal image can be obtained again, and hence the anti-peeping objective can be achieved.

For instance, the structure of the display device may have various different forms, and the corresponding manufacturing method may also be not exactly the same. Illustration will be given below with reference to the accompanying drawings.

As illustrated in FIG. 1 which is a schematic structural view of a display device provided by the embodiment of the present invention, the display device comprises an interference display module 12 and a first display panel 11 disposed in the light-emitting direction of the interference display module 12. The interference display module 12 may include a second display panel 122 and a first polarization layer 121 disposed in the light-emitting direction of the second display panel 122.

For instance, the first display panel is configured to allow the polarized light to be transmitted therethrough.

In the display device as illustrated in FIG. 1, light of an interference image generated by the interference display module 12 will be superimposed to light of a display image generated by the first display panel 11, so that users can only view an unordered image and cannot view a normal image when viewing the display device under glasses-free state. On the other hand, the light emitted by the interference display module is polarized light, so that only a person wearing spectacles capable of filtering the polarized light can view the normal display image subsequently. Thus, users wearing the spectacles can normally view the image but users not wearing the spectacles can only view the interfered image, so that the anti-peeping objective can be achieved.

Similarly, as illustrated in FIG. 1, the interference display module 12 in the embodiment further includes a first phase retardation film 123. The first phase retardation film 123 is disposed between the first polarization layer 121 and the first display panel 11.

By arrangement of the first phase retardation film 123, light emitted by the second display panel 122 can be transmitted through the first phase retardation film 123 after being transmitted through the first polarization layer 121, and be converted into circularly polarized light. The circularly polarized light has better interference effect, is difficult to crack, and hence has high safety.

For instance, the direction of an optical axis of the first phase retardation film 123 and a transmission direction of the first polarization layer 121 may be at a certain angle so as to satisfy the condition of forming the circularly polarized light. For instance, the angle may be $\pi/4$ or $\pi/4\pm2\pi$.

For instance, the first phase retardation film may be a film-type patterned retarder (FPR) film. The function of the FPR film is the same with that of a quarter-wave plate. Polarized light is obtained after the light emitted by the second display panel 122 is transmitted through the first polarization layer 121, and the circularly polarized light is obtained after the polarized light is transmitted through the quarter-wave plate.

For instance, the first polarization layer 121 may also be directly integrated into the FPR film for convenient production.

For instance, the first display panel 11 and/or the second display panel 122 may be an organic light emitting diode (OLED) display panel.

The OLED display panel has self-luminous characteristic and large viewing angle and can save electricity. It should be understood that in some replaceable embodiments, the first display panel may also be a component with display function such as a liquid crystal display (LCD) panel; the embodiments of the present invention will not be affected no matter which display component is adopted; and corresponding technical proposals shall also fall within the scope of protection of the present invention.

In some examples, the first display panel 11 is a transparent OLED display panel.

In some examples, the color of each subpixel in the interference display module 12 is respectively complementary to the color of a subpixel at a corresponding position of the first display panel 11, and the size of the subpixel in the interference display module 12 is respectively equal to the size of the subpixel at the corresponding position of the first display panel 11. For instance, both the interference display module 12 and the first display panel 11 include a plurality of subpixels. The case that the subpixels in the first display panel 11 correspond to the subpixels in the interference display module 12 indicates that the subpixels are at least partially overlapped or adjacent in a plan view. For instance, the number of the subpixels of the interference display module 12 is the same as that of the subpixels of the first display panel 11, and the subpixels in the first display panel 11 are in one-to-one correspondence with the subpixels in the interference display module 12.

Figure 2:
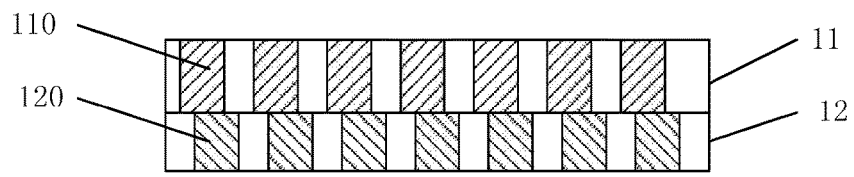
FIG. 2 is a schematic sectional view of a display device provided by the embodiment of the present invention.

For instance, as illustrated in FIG. 2, when the first display panel 11 and the interference display module 12 are superimposed to each other, the subpixels in the first display panel 11 and the subpixels in the interference display module 12, which correspond to each other, may be completely overlapped or partially overlapped in the direction perpendicular to the first display panel 11, or adjacent to each other in the planar direction. FIG. 2 only illustrates the case of partial overlapping. That is to say, subpixels 110 in the first display panel 11 and subpixels 120 in the interference display module 12, which correspond to each other, are at least partially overlapped or adjacent in the plan view.

Thus, by adoption of appropriate drive control, the brightness of light finally emitted by the interference display module 12 at each subpixel is equal to the brightness of the light emitted by the first display panel 11, so that an image finally viewed by glasses-free viewers is a white image, and hence better interference effect can be achieved. However, the embodiment of the present invention is not limited thereto, as long as the image of the interference display module can interfere with the recognition of the normal display image of the first display panel by the viewers.

"Complementary to each other" here is consistent with the understanding in the prior art. If one color and another color can be mixed to obtain white, the two colors may be construed as being complementary to each other. For instance, in actual application, the first display panel 11 may include red subpixels, green subpixels and blue subpixels, and the interference display module 12 may include cyan subpixels, magenta subpixels and yellow subpixels.

The red subpixels in the first display panel 11 correspond to the cyan subpixels in the interference display module 12 in position; the green subpixels in the first display panel 11 correspond to the magenta subpixels in the interference display module 12; and the blue subpixels in the first display panel 11 correspond to the yellow subpixels in the interference display module 12 in position, wherein red and cyan are complementary to each other; green and magenta are complementary to each other; and blue and yellow are complementary to each other.

Correspondingly, when the display device is driven, the method may further comprise inputting drive voltage into the second display panel of the interference display module, so that the brightness of the light emitted by the interference display module can be the same with the brightness of the light emitted by the first display panel, and hence the image displayed by the display device can be a white image.

Moreover, in the display device, the following means may also be adopted: under the same input drive voltage, the brightness of the light emitted by the interference display module 12 is the same with the brightness of the light emitted by the first display panel 11.

The advantage is that the same drive voltage may be adopted for driving in the process of driving the interference display module 12 and the first display panel 11, so that the operation is convenient. Of course, when this means is not adopted, the image finally displayed by the display device may also be a white display image by controlling the drive voltage inputted into the two display panels.

For instance, by setting of parameters (e.g., parameters of a data drive circuit and parameters of OLEDs) of some hardware in the first display panel 11 and/or parameters of some hardware in the second display panel 122, the brightness of light emitted by the second display panel 122 at each subpixel can be twice the brightness of light emitted by the first display panel 11 at the same position when the same drive voltage (including data voltage, working voltage and so on) is input into the first display panel 11 and the second display panel 122. In this way, after the light of the second display panel 122 is transmitted through the first polarization layer 121, half of the light is filtered, so the brightness of light finally emitted by the entire interference display module 12 at the position of the subpixel is almost the same with the brightness of light emitted by the first display panel 11 at the position of the subpixel, and hence the white image can be obtained by mixing.

Correspondingly, in the process of driving the display device, the step of "inputting the drive voltage into the second display panel in the interference display module, so that the brightness of the light emitted by the interference display module can be the same with the brightness of the light emitted by the first display panel" may indicate that drive voltage the same with the drive voltage inputted into the first display panel is inputted into the interference display module.

The anti-peeping display system comprising the display device 100 also refers to FIG. 1 and comprises the display device 100 and anti-peeping spectacles 200. The anti-peeping spectacles 200 include a spectacles frame and filter lenses. The filter lenses are configured to filter the polarized light emitted by the interference display module 12.

For instance, the filter lens in the embodiment may be that a second polarization layer is disposed on a common lens; the polarization direction of the second polarization layer is opposite to the polarization direction of the first polarization layer 121 in the display device 100; a second phase retardation film is disposed on the outer side of the first polarization layer; the second phase retardation film is, for instance, a quarter-wave plate, and for instance, may be an FPR film, and the optical rotational direction of the FPR film is opposite to the optical rotational direction of an FPR film in the interference display module; and for instance, the light emitted by the interference display module is left-handed light, so the filter lens adopts a right-handed FPR film. Corresponding linearly polarized light is obtained after the circularly polarized light emitted by the interference display module is transmitted through the FPR film of the filter lens. The linearly polarized light is subjected to light extinction by the second polarization layer on the filter lens, so that the light emitted by the interference display module can be filtered.

For instance, the second polarization layer and the second phase retardation film in the filter lens may be integrated for convenient production and small volume.

Figure 3:
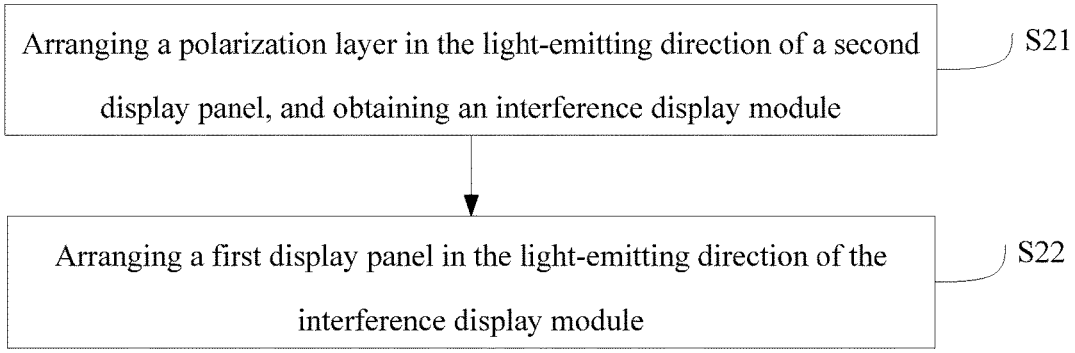
FIG. 3 is a flowchart of a method for manufacturing a display device provided by the embodiment of the present invention.

As illustrated in FIG. 3, the manufacturing method may comprise the following steps when used for manufacturing the display device as illustrated in FIG. 1:

S21: arranging the first polarization layer 121 in the light-emitting direction of the second display panel 122, and obtaining the interference display module 12; and S22: arranging the first display panel 11 in the light-emitting direction of the interference display module 12.

It should be understood that although description is given in the embodiment of the present invention by including the phase retardation films, in some replaceable embodiments, the display device may also not include the first phase retardation film, namely the interference display module may only include the second display panel and the first polarization layer disposed in the light-emitting direction of the second display panel. Correspondingly, the anti-peeping spectacles in the corresponding anti-peeping system may also not include a phase retarder, and the filter lens in the anti-peeping spectacles includes one second polarization layer perpendicular to the transmission direction of the first polarization layer in the display device, so as to filter the polarized light emitted by the interference display module. Thus, in the corresponding manufacturing method, the step of arranging the first phase retardation film is not required in the process of manufacturing the interference display module, either.

In the present invention, the terms "first", "second" and "third" are only intended to illustrate the objective and should not be construed as the indication or imply of the relative importance. Unless otherwise specified, the term "a plurality of" indicates two or more than two.

The foregoing is only the preferred embodiments of the present invention and not intended to limit the scope of protection of the present invention. The scope of protection of the present invention should be defined by the appended claims.

The application claims priority to the Chinese patent application No. 201610052354.X, filed Jan. 26, 2016, the disclosure of which is incorporated herein by reference as part of the application.

The invention claimed is:

1. A display device, comprising an interference display module and a first display panel disposed in a light-emitting direction of the interference display module, wherein light emitted by the interference display module is polarized light; and the first display panel is configured to allow the polarized light to be transmitted therethrough, wherein a color of each subpixel in the interference display module is respectively complementary to a color of subpixel at a corresponding position of the first display panel.

2. The display device according to claim 1, wherein a size of each subpixel in the interference display module is equal to a size of the subpixel at the corresponding position of the first display panel.

3. The display device according to claim 2, wherein the first display panel includes red subpixels, green subpixels and blue subpixels; the interference display module includes cyan subpixels, magenta subpixels and yellow subpixels;

the red subpixels in the first display panel correspond to the cyan subpixels in the interference display module in position; the green subpixels in the first display panel correspond to the magenta subpixels in the interference display module in position; and the blue subpixels in the first display panel correspond to the yellow subpixels in the interference display module in position.

4. The display device according to claim 1, wherein under a same input drive voltage, a brightness of the light emitted by the interference display module is the same with that of light emitted by the first display panel.

5. The display device according to claim 1, wherein the interference display module includes a second display panel and a first polarization layer disposed in a light-emitting direction of the second display panel.

6. The display device according to claim 5, wherein the interference display module further includes a first phase retardation film which is disposed between the first polarization layer and the first display panel.

7. The display device according to claim 6, wherein the first phase retardation film is a quarter-wave plate.

8. The display device according to claim 1, wherein each of the first display panel and the second display panel is an organic light-emitting diode (OLED) display panel.

9. The display device according to claim 1, wherein the first display panel is a transparent OLED display panel.

10. An anti-peeping display system, comprising the display device according to claim 1 and anti-peeping spectacles, wherein the anti-peeping spectacles include a spectacles frame and filter lenses; and
the filter lenses are configured to filter the polarized light emitted by the interference display module.

11. The system according to claim 10, wherein the interference display module further includes a first phase retardation film which is disposed between the first polarization layer and the first display panel;
the filter lens includes a second phase retardation film which has an optical rotational direction opposite to that of the first phase retardation film, and a second polarization layer; and
the second phase retardation film is disposed in an incident direction of the second polarization layer.

12. The system according to claim 11, wherein the second phase retardation film is a quarter-wave plate.

13. A display drive method, used for driving the display device according to claim 1, comprising:
driving the interference display module to generate an interference image upon the first display panel displaying a normal image.

14. The method according to claim 13, wherein
driving the interference display module to generate the interference image upon the first display panel displaying the normal image includes:
inputting drive voltage into the interference display module, so that a brightness of the light emitted by the interference display module can be the same with a brightness of the light emitted by the first display panel.

15. The method according to claim 14, wherein driving the interference display module to generate the interference image upon the first display panel displaying the normal image includes:
 inputting the drive voltage, which is the same with drive voltage inputted into the first display panel, into the interference display module.

16. A method for manufacturing a display device, used for manufacturing the display device according to claim 1, comprising:
 providing a first display panel and an interference display module, in which the light emitted by the interference display module is polarized light; and
 arranging the first display panel in the light-emitting direction of the interference display module.

\* \* \* \* \*